US008354718B2

(12) United States Patent
Wang et al.

(10) Patent No.: US 8,354,718 B2

(45) Date of Patent: Jan. 15, 2013

(54) SEMICONDUCTOR DEVICE INCLUDING AN ARRANGEMENT FOR SUPPRESSING SHORT CHANNEL EFFECTS

(75) Inventors: Chih-Chiang Wang, Hsin-Chu (TW); Yi-Ming Sheu, Hsinchu (TW); Ying-Shiou Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 329 days.

(21) Appl. No.: 11/751,959

(22) Filed: May 22, 2007

(65) Prior Publication Data

US 2008/0290412 A1 Nov. 27, 2008

(51) Int. Cl.
*H01L 21/02* (2006.01)

(52) U.S. Cl. ........ 257/344; 257/402; 257/360; 257/369; 257/327; 438/305; 438/301

(58) Field of Classification Search .................. 438/404; 257/189, 345, 349, 372, 344

See application file for complete search history.

(56) References Cited

U.S. PATENT DOCUMENTS

| | | | | |
|---|---|---|---|---|
| 5,668,024 | A * | 9/1997 | Tsai et al. | 438/199 |
| 5,719,425 | A * | 2/1998 | Akram et al. | 257/344 |
| 5,837,557 | A * | 11/1998 | Fulford et al. | 438/6 |
| 6,017,798 | A * | 1/2000 | Ilderem et al. | 438/286 |
| 6,190,981 | B1 * | 2/2001 | Lin et al. | 438/305 |
| 6,268,640 | B1 * | 7/2001 | Park et al. | 257/607 |
| 6,294,432 | B1 * | 9/2001 | Lin et al. | 438/301 |
| 6,426,278 | B1 * | 7/2002 | Nowak et al. | 438/528 |
| 7,074,623 | B2 * | 7/2006 | Lochtefeld et al. | 438/3 |
| 7,253,062 | B2 * | 8/2007 | Wang et al. | 438/286 |
| 7,253,481 | B2 * | 8/2007 | Wang et al. | 257/382 |
| 7,256,093 | B2 * | 8/2007 | Yu et al. | 438/289 |
| 7,361,973 | B2 * | 4/2008 | Chidambarrao et al. | 257/623 |
| 7,498,642 | B2 * | 3/2009 | Chen et al. | 257/408 |
| 2004/0061187 | A1 * | 4/2004 | Weber et al. | 257/408 |
| 2004/0173855 | A1 * | 9/2004 | Masuoka et al. | 257/371 |
| 2005/0139911 | A1 * | 6/2005 | Kim | 257/336 |
| 2005/0224873 | A1 * | 10/2005 | Yu et al. | 257/344 |
| 2006/0006427 | A1 * | 1/2006 | Tan et al. | 257/227 |
| 2006/0086987 | A1 * | 4/2006 | Chen et al. | 257/369 |
| 2006/0131648 | A1 * | 6/2006 | Ahn et al. | 257/347 |
| 2006/0216900 | A1 * | 9/2006 | Wang et al. | 438/306 |

(Continued)

OTHER PUBLICATIONS

Michael Stockinger, "Optimization of Ultra-Low Power CMOS Transistors," Dissertation, Oct. 1970, 5 pages.

*Primary Examiner* — David Vu
*Assistant Examiner* — Caleb Henry
(74) *Attorney, Agent, or Firm* — Haynes and Boone, LLP

(57) ABSTRACT

An apparatus comprising a substrate of first dopant type and first dopant concentration; pocket regions in the substrate and having the first dopant type and a second dopant concentration greater than the first dopant concentration; a gate stack over the substrate and laterally between the pocket regions; first and second source/drain regions on opposing sides of the gate stack and vertically between the gate stack and the pocket regions, the first and second source/drain regions having a second dopant type opposite the first dopant type and a third dopant concentration; and third and fourth source/drain regions having the second dopant type and a fourth dopant concentration that is greater than the third dopant concentration, wherein the pocket regions are between the third and fourth source/drain regions, and the third and fourth source/drain regions are vertically between the first and second source/drain regions and a bulk portion of the substrate.

20 Claims, 6 Drawing Sheets

300
310
315
370 307 375
390 350 308 355 395
305

U.S. PATENT DOCUMENTS

2007/0034906 A1* 2/2007 Wang et al. .................. 257/224
2007/0108524 A1* 5/2007 Ito et al. ....................... 257/349
2007/0228495 A1* 10/2007 Seto et al. .................... 257/402
2007/0254447 A1* 11/2007 Yu et al. ....................... 438/332
2007/0267694 A1* 11/2007 Ko et al. ...................... 257/344
2008/0023752 A1* 1/2008 Chen et al. .................. 257/327

* cited by examiner

SEMICONDUCTOR DEVICE INCLUDING AN ARRANGEMENT FOR SUPPRESSING SHORT CHANNEL EFFECTS

BACKGROUND

The drain current of a metal-oxide semiconductor (MOS) transistor will increase in some cases in which a parasitic current path exists between drain and source. This part of the drain current is poorly controlled by the gate contact since the current path is located deeper in the bulk substrate away from the gate. It adds to the subthreshold leakage current, leading to increased power consumption.

The amount of punchthrough current depends mainly on potential distribution under the channel. If the depletion area around the drain well extends too far to the source side, the potential barrier between source and drain is lowered and carriers start to move from source to drain. Therefore, punchthrough highly depends on the applied drain voltage and on the source/drain junction depths.

One way to reduce punchthrough effect is increasing the overall bulk doping level. As a result, source/drain depletion regions may become smaller and may not establish a parasitic current path. However, the higher bulk doping decreases mobility.

Some attempts to prevent punchthrough have made use of spatially restricted dopant implantations. For example, the delta doping of FIG. 1A employs a channel region between the source/drain regions 110 having regions 120 of varying dopant concentrations. In FIG. 1B, halo regions 140 interpose the source/drain regions 110 and the substrate bulk 130. In FIG. 1C, pocket implants 150 are implanted adjacent the lower region of the channel. However, these methods also do not provide satisfactory protection against punchthrough without significantly decreasing mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
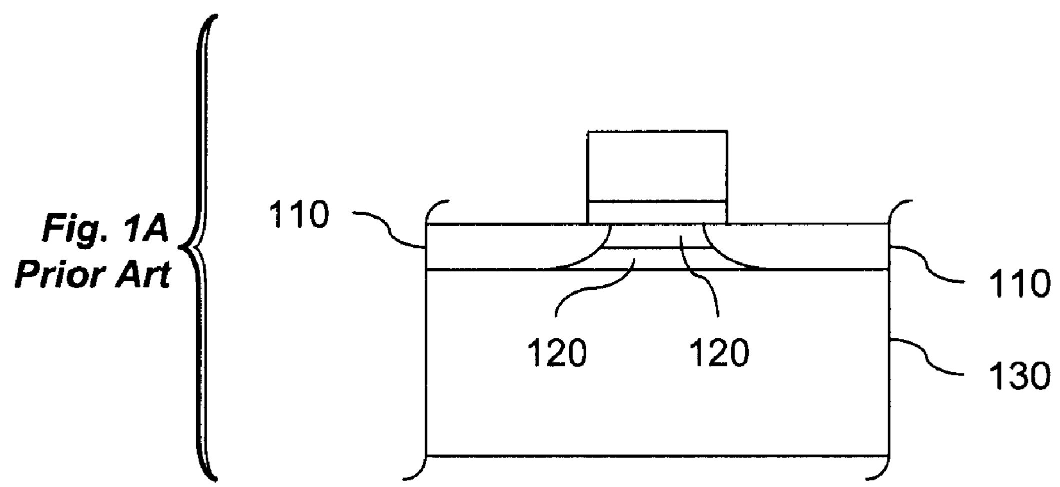
FIGS. 1A-1C are sectional views of various conventional apparatus.
Figure 1B:
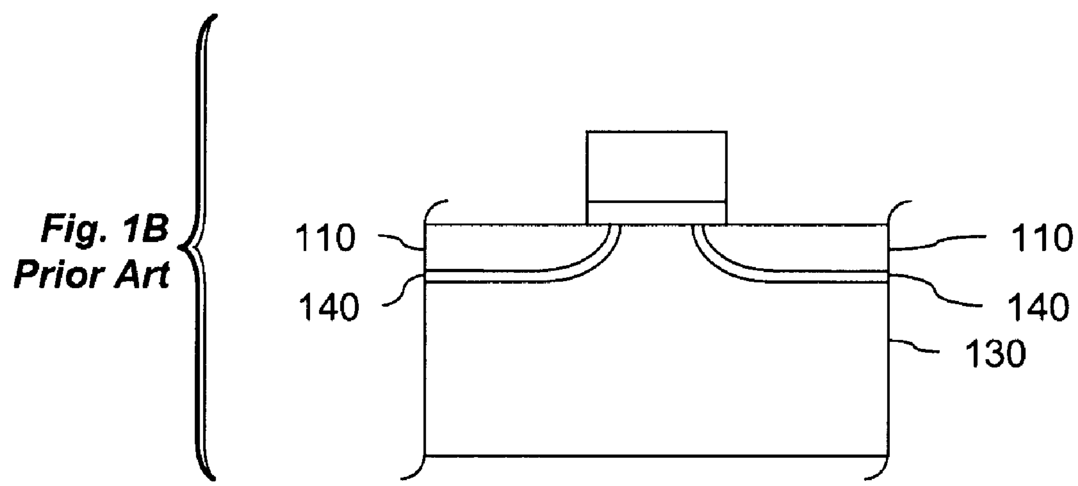
Figure 1C:
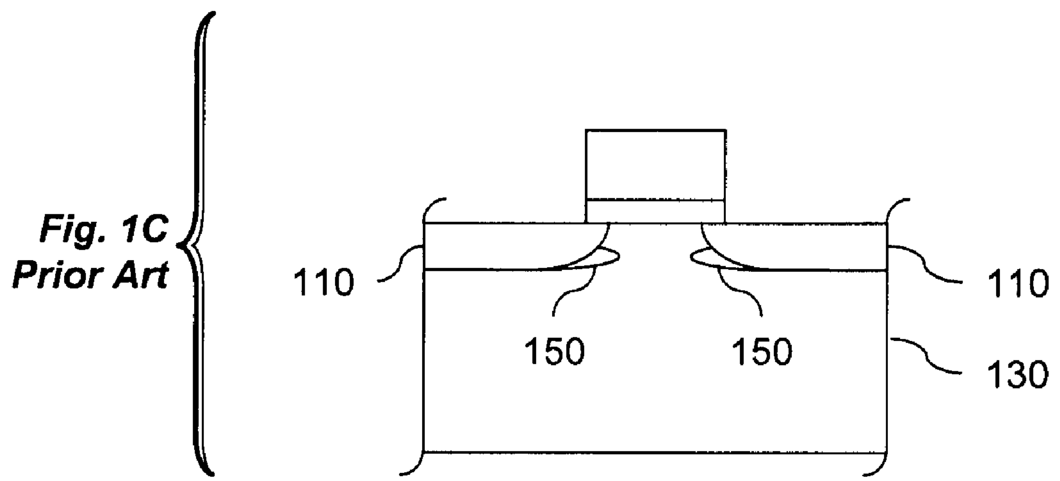

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2A:
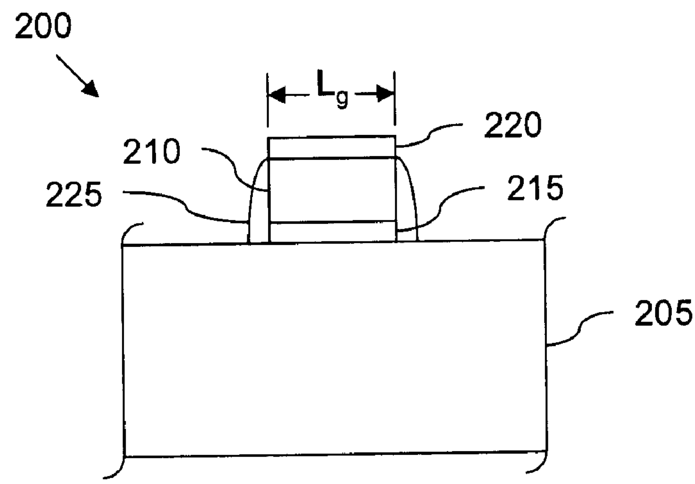
FIGS. 2A-2F are sectional views of an apparatus during serial stages of manufacture according to aspects of the present disclosure.

Referring to FIG. 2A, illustrated is a sectional view of an apparatus 200 in an intermediate stage of manufacture according to one or more aspects of the present disclosure. The apparatus 200 may be or include a metal-oxide semiconductor (MOS) device, such as may be employed in a complementary MOS (CMOS) device. The applications and/or implementations comprising the apparatus 200 are not limited within the scope of the present disclosure.

The apparatus 200 includes a substrate 205. The substrate 205 may be or include a bulk substrate comprising doped silicon, silicon germanium, silicon carbon and/or other silicon-containing materials, among other materials within the scope of the present disclosure. The substrate 205 may also or alternatively be or comprise a silicon-on-insulator (SOI) substrate.

The apparatus 200 also includes a gate stack comprising at least a gate electrode 210 and a gate oxide 215 interposing the gate electrode 210. The gate electrode 210 may have a metallic and/or doped semiconductor composition, and may comprise one or more layers. In an exemplary embodiment, the gate electrode 210 has a gate length Lg of about 30 nm, although other lengths are also within the scope of the present disclosure. The gate oxide 215 may comprise silicon oxide and/or other oxides, among other materials. In an exemplary embodiment, the gate oxide 215 has a thickness of about 16 angstroms, although other thicknesses are also within the scope of the present disclosure. The gate electrode 210 and the gate oxide 215 may be formed by conventional or future-developed methods, such as chemical vapor deposition (CVD) or variants thereof, or by selective or other epitaxial growth.

The apparatus 200 may also include a layer 220 employed during the formation of the gate stack and/or other features of the apparatus 200. The layer 220 may comprise photoresist, hardmask and/or other mask materials. In an exemplary embodiment, a thin oxide layer is epitaxially grown on the substrate 205, a conductive material layer is blanket-deposited over the oxide layer, and the layer 220 is defined on the conductive material layer by depositing a photoresist material and then exposing and developing photoresist material to form the layer 220, which can then be employed as a mask during subsequent etching of the conductive material layer and/or the oxide layer to define the gate electrode 210 and/or the gate oxide 215, respectively.

One or more spacers 225 may then be formed around or on opposing sides of the gate stack. The spacers 225 may be formed by blanket depositing a dielectric material over the gate stack and the substrate 205, including along the sidewalls of the gate electrode 210 and the gate oxide 215, and subsequently isotropic etching of the dielectric material to form the spacers 225 in approximately the shape shown in FIG. 2A, among other possible shapes.

Figure 2B:
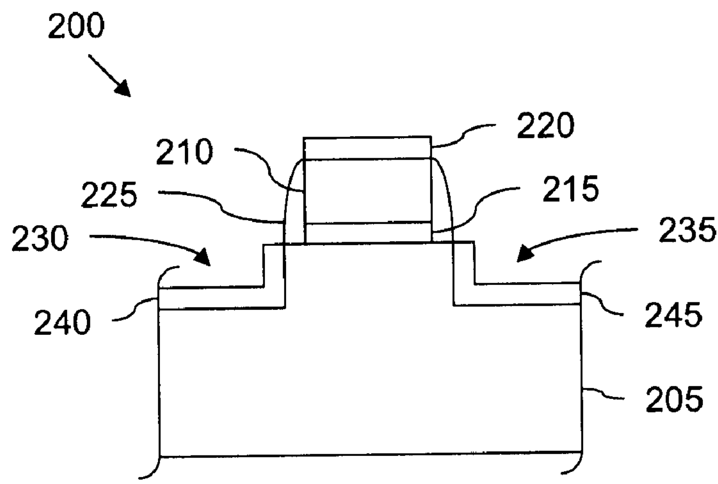

Referring to FIG. 2B, illustrated is a sectional view of the apparatus 200 shown in FIG. 2A in a subsequent stage of manufacture according to one or more aspects of the present disclosure, during which a first recess 230 and a second recess 235 are formed in the substrate 205 and subsequently lined with a first layer 240 and a second layer 245, respectively. The recesses 230, 235 may be formed in the substrate 205 by anisotropic or isotropic etching while employing the mask layer 220 and/or the spacers 225, such as by reactive ion etching, ion beam milling, and/or other processes. The layers 240, 245 may comprise semiconductor material that is doped before, during or after formation. For example, the layers 240, 245 may be epitaxially grown from the substrate 205, in such a manner that they have substantially the same composition as the substrate, and the layers 240, 245 may be subsequently doped.

The layers 240, 245 are doped with the same dopant type as the substrate 205. However, the dopant concentration of the layers 240, 245 is higher than the dopant concentration of the substrate 205. In an exemplary embodiment, the layers 240, 245 have a dopant concentration of about 1.0E19 atoms/$cm^3$ whereas substrate 205 has a dopant concentration of about 1.0E15 atoms/$cm^3$. However, other dopant concentrations of the layers 240, 245 and/or the substrate 205 are also within the scope of the present disclosure.

Figure 2C:
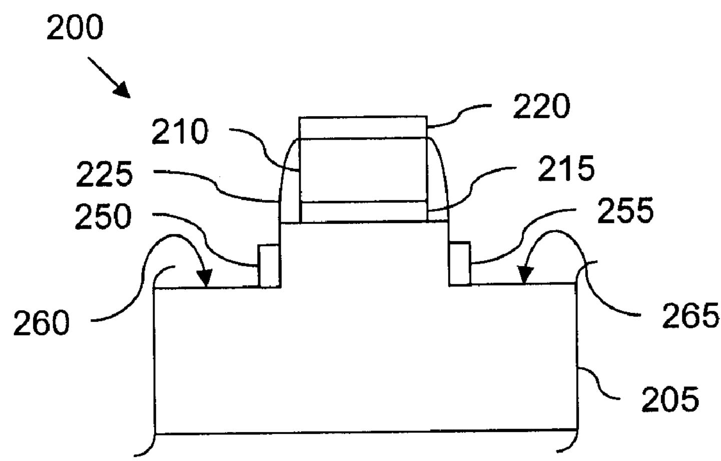

Referring to FIG. 2C, illustrated is a sectional view of the apparatus 200 shown in FIG. 2B in a subsequent stage of manufacture according to one or more aspects of the present disclosure, during which the doped semiconductor layers 240, 245 which are doped to a higher concentration than the substrate 205 are etched to form first and second pocket regions 250, 255. In an exemplary embodiment, such etching may be or include anisotropic etching, among other possible material removal processes. The etching or other material removal process may also leave the upper ends of the pocket regions 250, 255 at a lower level than the interface between the substrate 205 and the gate oxide 215, such as in the exemplary embodiment shown in FIG. 2C. Alternatively, the upper surfaces of the pocket regions 250, 255 may be substantially coplanar with the interface between the substrate 205 and the gate oxide. Nonetheless, as a result of the etching or other material removal process, a portion of the surfaces 260, 265 of the recesses 230, 235 are exposed, laterally opposite the pocket regions 250, 255 from the gate stack.

Figure 2D:
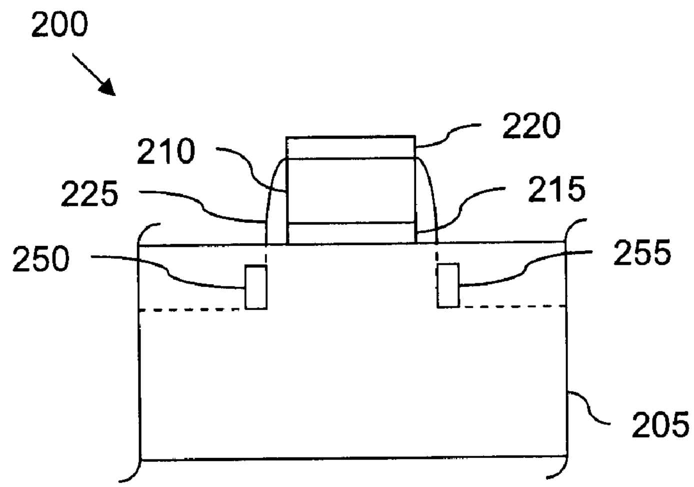

Referring to FIG. 2D, illustrated is a sectional view of the apparatus 200 shown in FIG. 2C in a subsequent stage of manufacture according to one or more aspects of the present disclosure, during which the recesses 230, 235 (shown by dashed lines in FIG. 2D) are filled with material substantially similar or identical to the composition of the substrate 205. For example, selective epitaxy may be utilized to grow silicon from the substrate 205 to fill the recesses 230, 235 around the pocket regions 250, 255. Selective deposition, or blanket deposition with a subsequent material removal process, may alternatively or additionally be employed to fill the recesses 230, 235 around the pocket regions 250, 255. After the recesses 230, 235 are filled with the material of or similar to that of the substrate 205, the fill material may be doped to, for example, match the dopant concentration of the substrate 205.

Figure 2E:
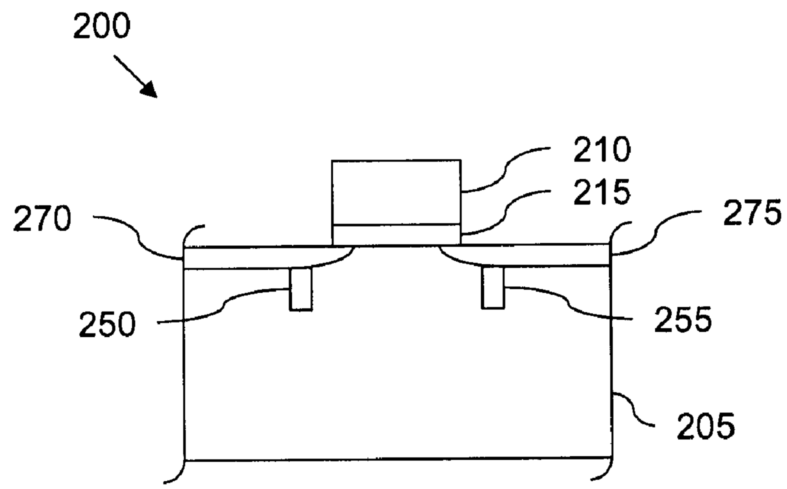

Referring to FIG. 2E, illustrated is a sectional view of the apparatus 200 shown in FIG. 2D in a subsequent stage of manufacture according to one or more aspects of the present disclosure, during which the layer 220 and the spacers 225 are removed via one or more etching and/or other material removal processes. Lightly doped source/drain regions 270, 275 are then formed in the substrate 205 around or on opposing sides of the gate stack via one or more conventional or future-developed ion implantation processes. The lightly doped source/drain regions 270, 275 are doped with an opposite dopant type than the substrate 205 and the pocket regions 250, 255. In an exemplary embodiment, the lightly doped source/drain regions 270, 275 extend into the substrate to a point adjacent or proximate the upper ends of the pocket regions 250, 255, and may also extend a short distance inwards underneath the gate oxide 215.

Figure 2F:
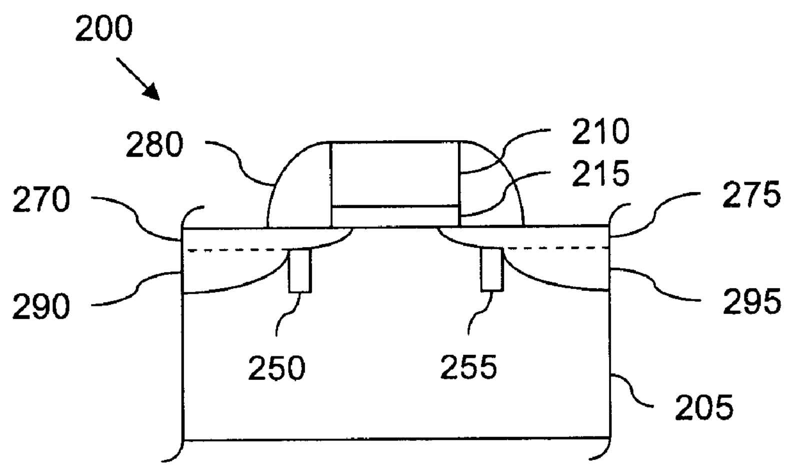

Referring to FIG. 2F, illustrated is a sectional view of the apparatus 200 shown in FIG. 2E in a subsequent stage of manufacture according to one or more aspects of the present disclosure, during which spacers 280 are formed around or on opposing sides of the gate stack. The spacers 280 may be substantially similar in composition and manufacture to the spacers 225 described above, although the spacers 280 may be substantially wider than the spacers 225. For example, the spacers 280 may extend laterally from the gate stack to or past the outer sides of the pocket regions 250, 255, such as in the exemplary embodiment shown in FIG. 2F.

Heavily doped source/drain regions 290, 295 are then formed through the lightly doped source/drain regions 270, 275 in the substrate 205 around or on opposing sides of the gate stack and spacers 280 via one or more conventional or future-developed ion implantation processes. In FIG. 2F, the approximate theoretical boundary between the lightly doped source/drain regions 270, 275 and the heavily doped source/drain regions 290, 295 is indicated by dashed lines. The heavily doped source/drain regions 290, 295 are doped with an opposite dopant type than the substrate 205 and the pocket regions 250, 255, and to a higher dopant concentration than that of the lightly doped source/drain regions 270, 275. In an exemplary embodiment, the heavily doped source/drain regions 290, 295 extend into the substrate to a point adjacent or proximate the side-boundary ends of the pocket regions 250, 255, and may also extend a short distance inwards underneath the spacers 280.

Figure 3:
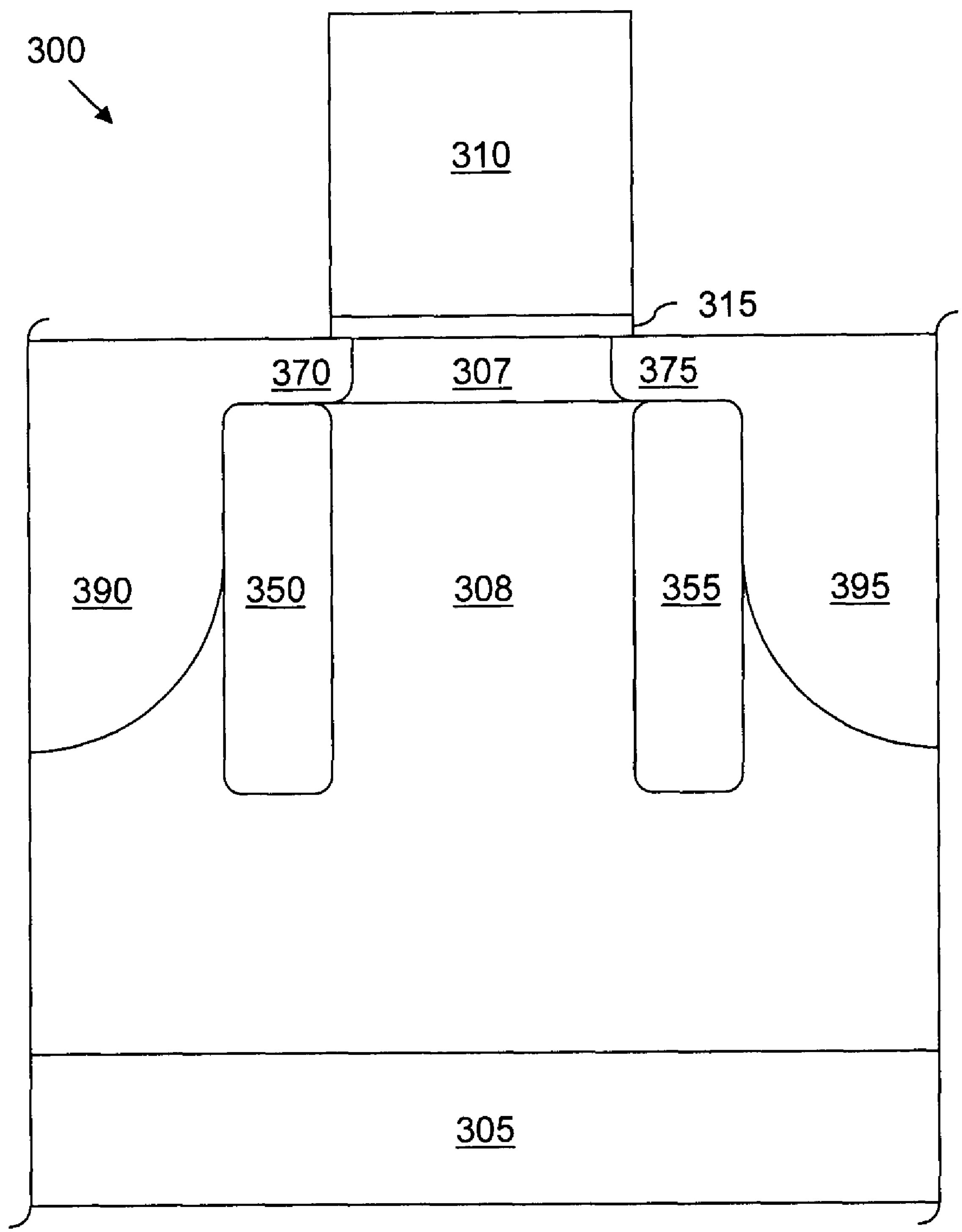
FIG. 3 is a sectional view of an apparatus according to one or more aspects of the present disclosure.

Referring to FIG. 3, illustrated is a sectional view of another embodiment of the apparatus 200 shown in FIG. 2F, herein designated by reference numeral 300. The apparatus 300 includes a substrate 305 having a p-type dopant concentration of about 1.0E15 atoms/$cm^3$. The apparatus 300 also includes lightly doped source/drain regions 370, 375 having an n-type dopant concentration and heavily doped source/drain regions 390, 395 having an n-type dopant concentration that is greater than that of the lightly doped source/drain regions 370, 375. The apparatus 300 also includes pocket regions 350, 355 having a p-type dopant concentration of about 1.0E19 atoms/$cm^3$. A region 307 of the substrate 305 has a p-type dopant concentration of 6.0E17 atoms/$cm^3$. Another region 308 of the substrate 305, positioned vertically between the region 307 and the bulk portion of the substrate 305 and laterally between the pocket regions 350, 355, has a p-type dopant concentration of about 2.5E18 atoms/$cm^3$. The apparatus 300 also includes a gate oxide layer 315 located on the substrate region 307 and at least slightly overlapping the lightly doped source/drain regions 370, 375 in a lateral direction, and gate electrode 310 located on the gate oxide 315.

Figure 4A:
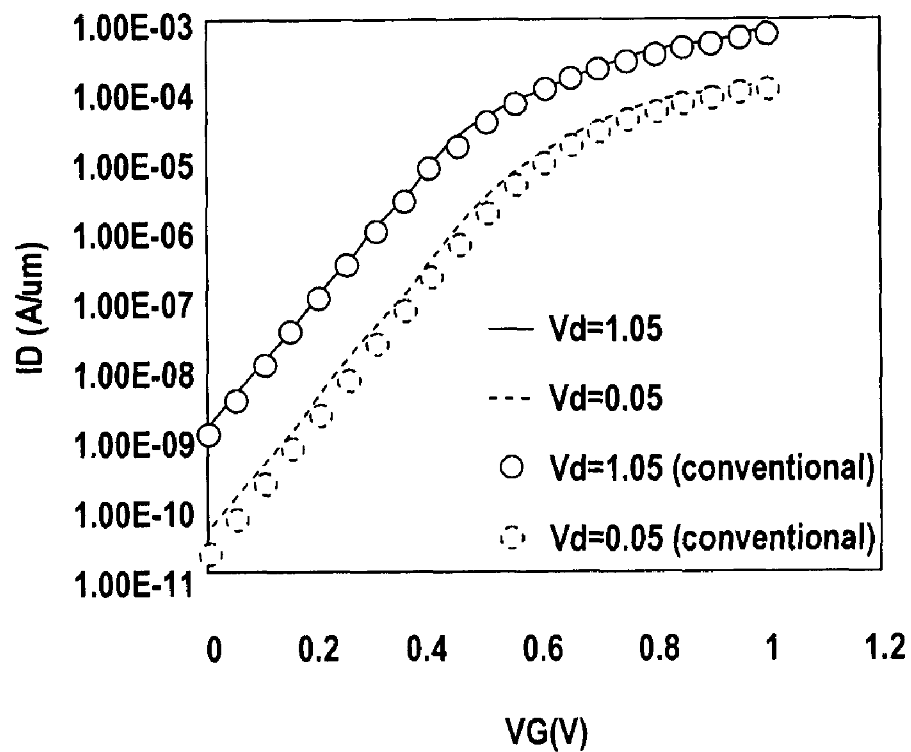
FIG. 4A is a graph demonstrating one or more aspects of the present disclosure.

Referring to FIG. 4A, illustrated is a graph depicting an exemplary relationship of drain current vs. gate voltage for a conventional apparatus and an apparatus according to one or more aspects of the present disclosure. As the graph demonstrates, because the apparatus according to one or more aspects of the present disclosure (depicted by the solid and dashed line for Vd of 1.05 V and 0.05 V, respectively) incorporates pocket regions of high dopant concentration between the heavily doped source/drain regions and the channel, better results may be achieved with the same channel length, or the conventional results may be obtained despite possibly having a reduced channel width, while still avoiding punchthrough.

Figure 4B:
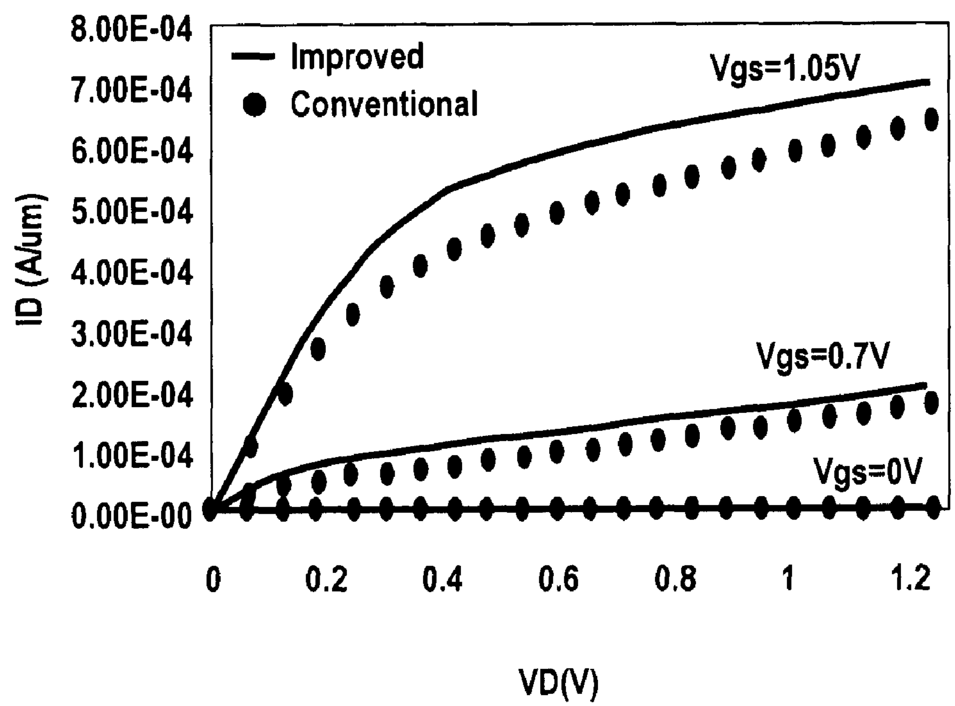
FIG. 4B is a graph demonstrating one or more aspects of the present disclosure.

Referring to FIG. 4B, illustrated is a graph depicting an exemplary relationship of drain current vs. drain voltage for conventional apparatus (depicted by dotted lines for Vgs of 0V, 0.7V and 1.05 V) and apparatus according to one or more aspects of the present disclosure (depicted by corresponding solid lines for Vgs of 0V, 0.7V and 1.05 V). As the graph demonstrates, because the apparatus according to one or more aspects of the present disclosure incorporates pocket regions of high dopant concentration between the heavily doped source/drain regions and the channel, better current driving may be achieved.

Figure 5:
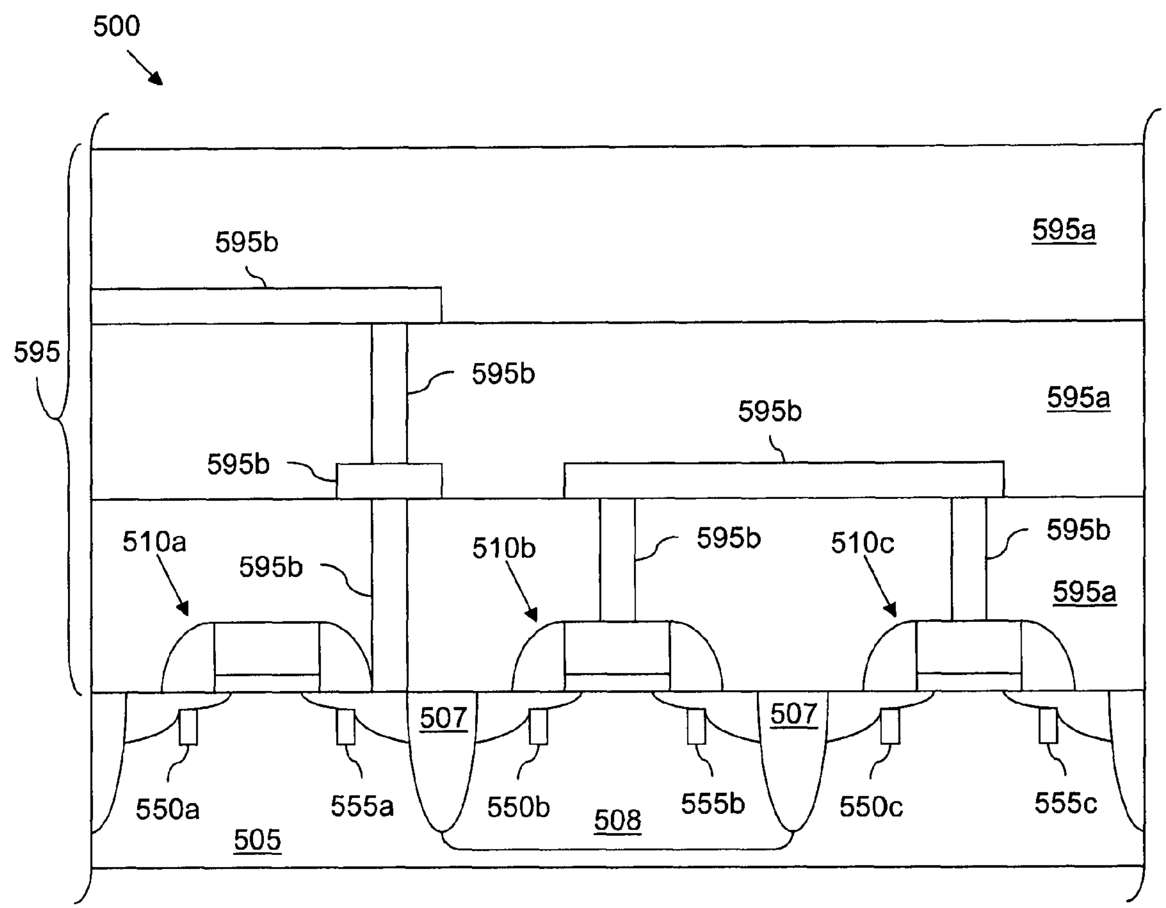
FIG. 5 is a sectional view of an apparatus according to one or more aspects of the present disclosure.

Referring to FIG. 5, illustrated is a sectional view of a device 500 according to one or more aspects of the present disclosure. The device 500 is an exemplary implementation of the apparatus 200 shown in FIG. 2F and/or the apparatus 300 shown in FIG. 3. For example, the device 500 includes a substrate 505 and a plurality of apparatus 510*a-c* each formed at least partially in the substrate 505 and at least partially separated from one another by one or more dielectric isolation regions 507. Each of the plurality of apparatus 510*a-c* are substantially similar in manufacture and composition to the apparatus 200 shown in FIG. 2F and/or the apparatus 300 shown in FIG. 3. Moreover, one of the apparatus 510*b* is formed with an opposite doping scheme relative to the other apparatus 510*a*, 510*c*. For example, the substrate 505 may have a p-type dopant, and the apparatus 510*a*, 510*c* formed directly in the substrate 505 have pocket regions 550*a*, 555*a*, 550*c*, 555*c* having a p-type dopant, whereas the apparatus 510*b* is formed in an n-type well 508 such that the pocket regions 550*b*, 555*b* have an n-type dopant.

The apparatus 500 also includes an interconnect structure 595 comprising a plurality of dielectric layers 595*a* and a plurality of vertical and lateral interconnects 595*b* each electrically isolated from one another by portions of one or more of the dielectric layers 595*a*. Ones of the interconnects 595*b* contact the apparatus 510*a-c* according to the desired interconnection scheme.

In view of the above, it should be evident that the present disclosure introduces an apparatus comprising: (1) first and second pocket regions each located in a substrate and being greater in depth than in width, the pocket regions each being doped to a greater concentration relative to the substrate; (2) a gate stack located over the substrate and laterally positioned between the first and second pocket regions; (3) first and second source/drain regions laterally positioned on opposing sides of the gate stack and vertically positioned in the substrate between the gate stack and the first and second pocket regions, respectively; and (4) third and fourth source/drain regions each being doped to a greater concentration relative to the first and second source/drain regions, wherein the first and second pocket regions are collectively laterally positioned between the third and fourth source/drain regions, and wherein the third and fourth source/drain regions are vertically positioned in the substrate between the first and second source/drain regions, respectively, and a bulk portion of the substrate. The first and second pocket regions may each have a width of about 10 nm and a depth of about 40 nm. The substrate may comprise a first region and a second region, wherein: (i) the first region is laterally positioned between the first and second source/drain regions and vertically positioned adjacent the gate stack; (ii) the second region is laterally positioned between the first and second pocket regions and vertically positioned adjacent the first region; and (iii) the second region is doped to a greater concentration relative to the first region. The substrate, including the first and second pocket regions and the first, second, third and fourth source/drain regions, may comprise doped silicon. In an exemplary embodiment, the substrate, including the first, second, third and fourth source/drain regions, comprises doped silicon, and the first and second pocket regions comprise at least one of doped silicon germanium and doped silicon carbon.

The present disclosure also introduces an apparatus comprising a substrate having a first dopant type and a first dopant concentration; first and second pocket regions each located in the substrate and having the first dopant type and a second dopant concentration, wherein the second dopant concentration is greater than the first dopant concentration; a gate stack located over the substrate and laterally positioned between the first and second pocket regions; first and second source/drain regions laterally positioned on opposing sides of the gate stack and vertically positioned in the substrate between the gate stack and the first and second pocket regions, respectively, wherein the first and second source/drain regions each have a second dopant type and a third dopant concentration, and wherein the second dopant type is opposite the first dopant type; and third and fourth source/drain regions having the second dopant type and a fourth dopant concentration, wherein the fourth dopant concentration is greater than the third dopant concentration, wherein the first and second pocket regions are collectively laterally positioned between the third and fourth source/drain regions, and wherein the third and fourth source/drain regions are vertically positioned in the substrate between the first and second source/drain regions, respectively, and a bulk portion of the substrate. The first and second pocket regions may each have a width of about 10 nm and a depth of about 40 nm. The gate stack may have a gate length of about 30 nm and may includes a gate electrode and a gate oxide, wherein the gate oxide is vertically positioned between the gate electrode and the substrate, and wherein the gate oxide may have a thickness of about 16 angstroms. The first dopant concentration may be about 6.0E17 atoms/cm3 and the second dopant concentration may be about 1.0E19 atoms/cm3. The substrate may comprise a first region and a second region, wherein: the first region may be laterally positioned between the first and second source/drain regions and may be vertically positioned adjacent the gate stack; the second region may be laterally positioned between the first and second pocket regions and may be vertically positioned adjacent the first region; the first region may have the first dopant type and the first dopant concentration; and the second region may have the first dopant type and a fifth dopant concentration that is greater than the first dopant concentration and less than the second dopant concentration. The substrate, including the first and second pocket regions and the first, second, third and fourth source/drain regions, may comprise doped silicon. Alternatively, the substrate, including the first, second, third and fourth source/drain regions, may comprise doped silicon, and the first and second pocket regions may comprise doped silicon germanium, silicon carbon and/or other silicon-containing materials.

The present disclosure also provides a method comprising: forming a gate stack over a substrate, wherein the substrate has a first dopant type and a first dopant concentration; forming first and second pocket regions in the substrate on opposing sides of the gate stack, wherein the first and second pocket regions each have the first dopant type and a second dopant concentration, and wherein the second dopant concentration is greater than the first dopant concentration; forming first and second source/drain regions in the substrate, wherein the first and second source/drain regions have a second dopant type and a third dopant concentration, wherein the second dopant type is opposite the first dopant type, and wherein the first and second source/drain regions are laterally positioned on opposing sides of the gate stack and vertically positioned between the gate stack and the first and second pocket regions; and forming third and fourth source/drain regions in the substrate, wherein the third and fourth source/drain regions have the second dopant type and a fourth dopant concentration, wherein the fourth dopant concentration is greater than the third dopant concentration, wherein the third and fourth source/drain regions are vertically positioned between the first and second source/drain regions and a bulk portion of the substrate, and wherein the first and second pocket regions are collectively laterally positioned between the third and fourth source/drain regions. Forming the first and second pocket regions may comprise: forming first and second recessed regions in the substrate on opposing sides of the gate stack; forming first and second layers lining the first and second recessed regions, respectively; and removing a portion of the first layer and a portion of the second layer to form the first and second pocket regions, respectively. Forming the first and second recessed regions may comprise etching the substrate using at least the gate stack as a mask. Forming the first and second recessed regions may comprise forming spacers on opposing sides of the gate stack and etching the substrate using at least the spacers and the gate stack as a mask. Forming the first and second layers may comprise depositing at least one of silicon, silicon germanium, silicon carbon and/or other silicon-containing materials on surfaces of the first and second recessed regions, respectively. Forming the first and second layers may comprise expitaxially growing at least one of silicon, silicon germanium, silicon carbon and/or other silicon-containing materials on surfaces of the first and second recessed regions, respectively. The method may further comprise, after removing the portion of the first layer and the portion of the second layer to form the first and second pocket regions, respectively, filling the first and second recesses with a material, wherein forming the first and second source/drain regions comprises forming the first and second source/drain regions in the material filling the first and second recesses, respectively, and wherein forming the third and fourth source/drain regions comprises forming the third and fourth source/drain regions in the material filling the first and second recesses, respectively. The substrate may have a composition substantially similar to the material filling the first and second recesses.

The present disclosure also introduces a device comprising: (1) a substrate having a first dopant type and a first dopant concentration; (2) a first apparatus, comprising: (2a) first and second pocket regions each located in the substrate and having the first dopant type and a second dopant concentration, wherein the second dopant concentration is greater than the first dopant concentration; (2b) a gate stack located over the substrate and laterally positioned between the first and second pocket regions; (2c) first and second source/drain regions laterally positioned on opposing sides of the gate stack and vertically positioned in the substrate between the gate stack and the first and second pocket regions, respectively, wherein the first and second source/drain regions each have a second dopant type and a third dopant concentration, and wherein the second dopant type is opposite the first dopant type; and (2d) third and fourth source/drain regions having the second dopant type and a fourth dopant concentration, wherein the fourth dopant concentration is greater than the third dopant concentration, wherein the first and second pocket regions are collectively laterally positioned between the third and fourth source/drain regions, and wherein the third and fourth source/drain regions are vertically positioned in the substrate between the first and second source/drain regions, respectively, and a bulk portion of the substrate; (3) a second apparatus located at least partially in the substrate; and (4) an interconnect structure located over the substrate and comprising a plurality of interconnects electrically isolated from one another by portions of one or more dielectric layers, wherein a first one of the interconnects contacts the first apparatus, and wherein a second one of the interconnects connects the second apparatus. The first and second pocket regions may each have a width of about 10 nm and a depth of about 40 nm. The first dopant concentration may be about 6.0E17 atoms/$cm^3$ and the second dopant concentration may be about 1.0E19 atoms/$cm^3$. The substrate may comprise a first region and a second region, wherein: the first region is laterally positioned between the first and second source/drain regions and vertically positioned adjacent the gate stack; the second region is laterally positioned between the first and second pocket regions and vertically positioned adjacent the first region; the first region has the first dopant type and the first dopant concentration; and the second region has the first dopant type and a fifth dopant concentration that is greater than the first dopant concentration and less than the second dopant concentration. The substrate, including the first, second, third and fourth source/drain regions, may comprise doped silicon, and the first and second pocket regions may comprise one of doped silicon, doped silicon germanium, doped silicon carbon and/or other doped silicon-containing materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising:

first and second pocket regions each located in a substrate and being greater in depth than in width, the pocket regions each formed of a first material and each being doped to a greater concentration relative to the substrate;

a gate stack located over the substrate and laterally positioned between the first and second pocket regions;

first and second source/drain regions laterally positioned on opposing sides of the gate stack and vertically positioned in the substrate between the gate stack and the first and second pocket regions, respectively, the first and second source/drain regions each formed of a second material, the second material being different than the first material; and third and fourth source/drain regions each being doped to a greater concentration relative to the first and second source/drain regions, wherein the first and second pocket regions are collectively laterally positioned adjacent and between the third and fourth source/drain regions, and wherein the third and fourth source/drain regions are vertically positioned in the substrate between the first and second source/drain regions, respectively, and a bulk portion of the substrate, wherein the substrate comprises a first region and a second region, wherein:

the first region is below the gate stack and extends from the first source/drain region to the second source/drain region, the first region is doped at a first concentration; and the second region is below and physically contacts the first region and extends from the first pocket region to the second pocket region, the second region is doped at a second concentration that is greater than the first concentration.

2. The apparatus of claim 1 wherein the first and second pocket regions each have a width of about 10 nm and a depth of about 40 nm.

3. An apparatus, comprising:

first and second substantially rectangular shaped pocket regions each located in a substrate and each formed of a first material, the pocket regions each being doped to a greater concentration relative to the substrate;

a gate stack located over the substrate and laterally positioned between the first and second pocket regions;

first and second source/drain regions laterally positioned on opposing sides of the gate stack and vertically positioned in the substrate between the gate stack and the first and second pocket regions, respectively, the first and second source/drain regions each formed of a second material, the second material being different than the first material; and third and fourth source/drain regions each being doped to a greater concentration relative to the first and second source/drain regions, wherein the first and second pocket regions are collectively laterally positioned between the third and fourth source/drain regions, and wherein the third and fourth source/drain regions are vertically positioned in the substrate between the first and second source/drain regions, respectively, and a bulk portion of the substrate;

wherein the substrate comprises a first region and a second region, wherein:

the first region is laterally positioned between the first and second source/drain regions and vertically positioned adjacent the gate stack such that the first region is in physical contact with the gate stack;

the second region is laterally positioned between the first and second pocket regions and vertically positioned adjacent the first region such that the second region is in physical contact with the first region; and the second region is doped to a greater concentration relative to the first region.

4. The apparatus of claim 1 wherein the substrate, including the first and second pocket regions and the first, second, third and fourth source/drain regions, comprises doped silicon.

5. The apparatus of claim 1 wherein the substrate, including the first, second, third and fourth source/drain regions, comprises doped silicon, and wherein the first and second pocket regions comprise at least one of doped silicon germanium and doped silicon carbon.

6. An apparatus, comprising:

a substrate having a first dopant type and a first dopant concentration;

first and second epitaxially grown pocket regions each located in the substrate and having the first dopant type and a second dopant concentration, wherein the second dopant concentration is greater than the first dopant concentration, wherein at least one the first and second pocket regions has a substantially constant width along a depth of the pocket region, the depth of the pocket region extending vertically within the substrate from a top end to a bottom end of the pocket region, the first and second epitaxially grown pocket regions each formed of a first material;

a gate stack located over the substrate and laterally positioned between the first and second pocket regions;

first and second source/drain regions laterally positioned on opposing sides of the gate stack and vertically positioned in the substrate between the gate stack and the first and second pocket regions, respectively, wherein the first and second source/drain regions each have a second dopant type and a third dopant concentration, and wherein the second dopant type is opposite the first dopant type, the first and second source/drain regions each formed of a second material, the second material being different than the first material; and third and fourth source/drain regions having the second dopant type and a fourth dopant concentration, wherein the fourth dopant concentration is greater than the third dopant concentration, wherein the first and second pocket regions are collectively laterally positioned between the third and fourth source/drain regions, and wherein the third and fourth source/drain regions are vertically positioned in the substrate between the first and second source/drain regions, respectively, and a bulk portion of the substrate, wherein the substrate comprises a first region and a second region, wherein:

the first region is positioned under the gate stack and extends between the first and source/drain regions, the first region is doped at a first concentration; and the second region is positioned under the first region and extends between the first and pocket regions, the second region is doped at a second concentration that is greater than the first concentration.

7. The apparatus of claim 6 wherein the first and second pocket regions each have a width of about 10 nm and a depth of about 40 nm.

8. The apparatus of claim 6 wherein the gate stack has a gate length of about 30 nm and includes a gate electrode and a gate oxide, wherein the gate oxide is vertically positioned between the gate electrode and the substrate, and wherein the gate oxide has a thickness of about 16 angstroms.

9. The apparatus of claim 6 wherein the first dopant concentration is about 6.0E17 atoms/$cm^3$ and the second dopant concentration is about 1.0E19 atoms/$cm^3$.

10. The apparatus of claim 6 wherein:

the first region is laterally positioned between the first and second source/drain regions and vertically positioned adjacent the gate stack such that the first region is in physical contact with the gate stack;

the second region is laterally positioned between the first and second pocket regions and vertically positioned adjacent the first region such that the second region is in physical contact with the first region;

the first region has the first dopant type and the first dopant concentration; and the second region has the first dopant type and a fifth dopant concentration that is greater than the first dopant concentration and less than the second dopant concentration.

11. The apparatus of claim 6 wherein the substrate, including the first and second pocket regions and the first, second, third and fourth source/drain regions, comprises doped silicon.

12. The apparatus of claim 6 wherein the substrate, including the first, second, third and fourth source/drain regions, comprises doped silicon, and wherein the first and second pocket regions comprise at least one of doped silicon germanium and doped silicon carbon.

13. A device, comprising:

a substrate having a first dopant type and a first dopant concentration;

a first apparatus, comprising:

first and second strained pocket regions each formed of a first material located in the substrate and having the first dopant type and a second dopant concentration, wherein the second dopant concentration is greater than the first dopant concentration;

a gate stack located over the substrate and laterally positioned between the first and second pocket regions;

first and second source/drain regions laterally positioned on opposing sides of the gate stack and vertically positioned in the substrate between the gate stack and the first and second pocket regions, respectively, wherein the first and second source/drain regions each have a second dopant type and a third dopant concentration, and wherein the second dopant type is opposite the first dopant type, the first and second source/drain regions each formed of a second material, the second material being different than the first material; and third and fourth source/drain regions having the second dopant type and a fourth dopant concentration, wherein the fourth dopant concentration is greater than the third dopant concentration, wherein the first and second pocket regions are collectively laterally positioned between the third and fourth source/drain regions, and wherein the third and fourth source/drain regions are vertically positioned in the substrate between the first and second source/drain regions, respectively, and a bulk portion of the substrate; a second apparatus located at least partially in the substrate; and an interconnect structure located over the substrate and comprising a plurality of interconnects electrically isolated from one another by portions of one or more dielectric layers, wherein a first one of the interconnects contacts the first apparatus, and wherein a second one of the interconnects connects the second apparatus, wherein the substrate comprises a first region and a second region, the first region extends from the first source/drain region to the second source/drain region and is in physical contact with the gate stack, the second region extends from the first pocket region to the second pocket region and is in physical contact with the first region, the second region is doped to a greater concentration relative to the first region.

14. The device of claim 13 wherein the first and second pocket regions each have a width of about 10 nm and a depth of about 40 nm.

15. The device of claim 13 wherein the first dopant concentration is about 6.0E17 atoms/$cm^3$ and the second dopant concentration is about 1.0E19 atoms/$cm^3$.

16. The device of claim 13 wherein:

the first region has the first dopant type and the first dopant concentration; and the second region has the first dopant type and a fifth dopant concentration that is greater than the first dopant concentration and less than the second dopant concentration.

17. The device of claim 13 wherein:

the substrate, including the first, second, third and fourth source/drain regions, comprises doped silicon; and the first and second pocket regions comprise one of doped silicon, doped silicon germanium and doped silicon carbon.

18. The apparatus of claim 1, wherein the first pocket region has a width being substantially constant along the depth of the first pocket region.

19. The apparatus of claim 1, wherein the first and second pocket regions are formed of a first semiconductor material doped with a first doping species, wherein the first and second source/drain regions are formed of a second semiconductor material doped with a second doping species, and wherein the substrate is formed of a third semiconductor material doped with a third doping specifies, wherein the first, second and third semiconductor materials are different.

20. The apparatus of claim 1, wherein a top surface of one of the first and second pocket regions is substantially coplanar with an interface between a top surface of the substrate and a bottom surface of the gate stack.

* * * * *